(12) United States Patent
Roever et al.

(10) Patent No.: US 10,720,498 B2
(45) Date of Patent: Jul. 21, 2020

(54) SEMICONDUCTOR DEVICE STRUCTURE AND METHOD OF MANUFACTURE

(71) Applicant: NEXPERIA B.V., Nijmegen (NL)

(72) Inventors: Martin Roever, Hamburg (DE);
Soenke Habenicht, Hamburg (DE);
Stefan Berglund, Hamburg (DE);
Seong-Woo Bae, Hamburg (DE)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 16/196,055

(22) Filed: Nov. 20, 2018

(65) Prior Publication Data
US 2019/0165111 A1    May 30, 2019

(30) Foreign Application Priority Data

Nov. 24, 2017  (EP) .................................. 17203650

(51) Int. Cl.
*H01L 29/40* (2006.01)
*H01L 29/732* (2006.01)
(Continued)

(52) U.S. Cl.
CPC .......... *H01L 29/402* (2013.01); *H01L 21/762* (2013.01); *H01L 29/0615* (2013.01); *H01L 29/0619* (2013.01); *H01L 29/0649* (2013.01); *H01L 29/0804* (2013.01); *H01L 29/1004* (2013.01); *H01L 29/401* (2013.01); *H01L 29/66272* (2013.01); *H01L 29/732* (2013.01); *H01L 29/735* (2013.01); *H01L 29/78* (2013.01); *H01L 21/2251* (2013.01)

(58) Field of Classification Search
CPC . H01L 29/402; H01L 21/762; H01L 29/0619; H01L 29/0649; H01L 29/0804; H01L 29/1004; H01L 29/401; H01L 29/66272; H01L 29/732; H01L 21/2251
See application file for complete search history.

(56) References Cited

U.S. PATENT DOCUMENTS 5,606,195 A * 2/1997 Hooper .................. H01L 24/02
                                                          257/488
9,431,249 B2 * 8/2016 Pattanayak ........... H01L 21/266
(Continued)

OTHER PUBLICATIONS

Extended European Search Report and Written Opinion for corresponding application EP17203650.1, dated May 9, 2018, 8 pages.

*Primary Examiner* — Fernando L Toledo
*Assistant Examiner* — Neil R Prasad
(74) *Attorney, Agent, or Firm* — Ohlandt, Greeley, Ruggiero & Perle, L.L.P.

(57) ABSTRACT

This disclosure relates to a semiconductor device structure and method of manufacturing a semiconductor device. The semiconductor device structure comprises a semiconductor substrate having an edge region laterally separated from a device region; an edge termination structure arranged on the semiconductor substrate; wherein the edge termination structure comprises: a first oxide layer arranged on the substrate to extend from the active region to the edge region; an isolation layer arranged on top of the first oxide layer; and a metal layer arranged to at least partially cover the isolation layer and wherein the metal layer is further arranged to extend from the isolation layer to contact the edge region.

15 Claims, 7 Drawing Sheets

(51) Int. Cl.
    *H01L 29/06*       (2006.01)
    *H01L 29/78*       (2006.01)
    *H01L 29/735*     (2006.01)
    *H01L 21/762*     (2006.01)
    *H01L 29/08*       (2006.01)
    *H01L 29/10*       (2006.01)
    *H01L 29/66*       (2006.01)
    H01L 21/225    (2006.01)

(56) References Cited

U.S. PATENT DOCUMENTS

| | | |
|---|---|---|
| 2003/0222327 A1 | 12/2003 | Yamaguchi et al. |
| 2011/0204469 A1* | 8/2011 | Onishi ................ H01L 29/0619 |
| | | 257/490 |
| 2012/0126315 A1 | 5/2012 | Onishi et al. |
| 2013/0181328 A1 | 7/2013 | Cao et al. |
| 2013/0334695 A1* | 12/2013 | Tijssen .................... H01L 23/48 |
| | | 257/773 |
| 2014/0034999 A1* | 2/2014 | Korec ................ H01L 29/7393 |
| | | 257/140 |
| 2015/0056788 A1 | 2/2015 | Schmidt et al. |
| 2015/0187870 A1* | 7/2015 | Agata .................... H01L 29/404 |
| | | 257/409 |
| 2018/0219068 A1* | 8/2018 | Agata ................ H01L 29/7823 |

\* cited by examiner

SEMICONDUCTOR DEVICE STRUCTURE AND METHOD OF MANUFACTURE

CROSS REFERENCE TO RELATED APPLICATION

The present application claims foreign priority to European Patent Application No. 17203650 filed on Nov. 24, 2017, the entirety of which is incorporated by reference hereby.

FIELD

The present disclosure relates to a semiconductor device structure and method of manufacture. In particular the present disclosure relates to semiconductor device structure comprising an edge termination structure.

BACKGROUND

There is a trend in the semiconductor device market to provide small footprint devices without the loss of electrical performance. Small footprint devices are commonly used, for instance, in mobile communications devices such as mobile telephones and portable electronic devices.

In semiconductor device technology a combination of different structures, commonly known as edge or field terminations are used to isolate the active region of a semiconductor die from the edge of the semiconductor die to isolate parasitic effects where the edge of the semiconductor die contacts the active region. For example, structures such as Field Relief Electrodes (FREs), guard ring diffusions, field plates or a combination thereof may be used to improve the blocking voltage (BV) figure of merit for a particular device.

In semiconductor devices known field or edge termination structures are a limiting factor in reduction of the size of the device. An example of a known edge termination structure 101 is shown for example in FIG. 1, and is arranged such that the outer edge of the active device structure is defined by an isolating layer 102 on which the field relief electrode 104 is located. The semiconductor device 105 may be formed on a semiconductor substrate 106 and includes an active region 107. In addition the semiconductor device also includes a channel or guard ring 108 formed in the substrate 106.

The edge termination structure 101 is arranged between the guard ring 108 and the active region 107 of the semiconductor device 105. An isolation layer 102 is formed on the guard ring 108 and a metal layer 104 is then formed on the isolation layer 102. In addition, the metal layer 104 formed on the isolation layer 102 over the edge region 109 acts as a field plate to manipulate the electric fields in the device during operation and for example improve the blocking voltage of the device. Whilst not illustrated in FIG. 1, the metal layer 104 contacts the guard ring 108 by extending the metal layer through holes or vias in the isolation layer 102 to contact the guard ring 108. The metal layer 104 arranged over the active region 107 of the device functions as an interconnect metal for connecting external contacts of the semiconductor device to the active region.

Figure 1:
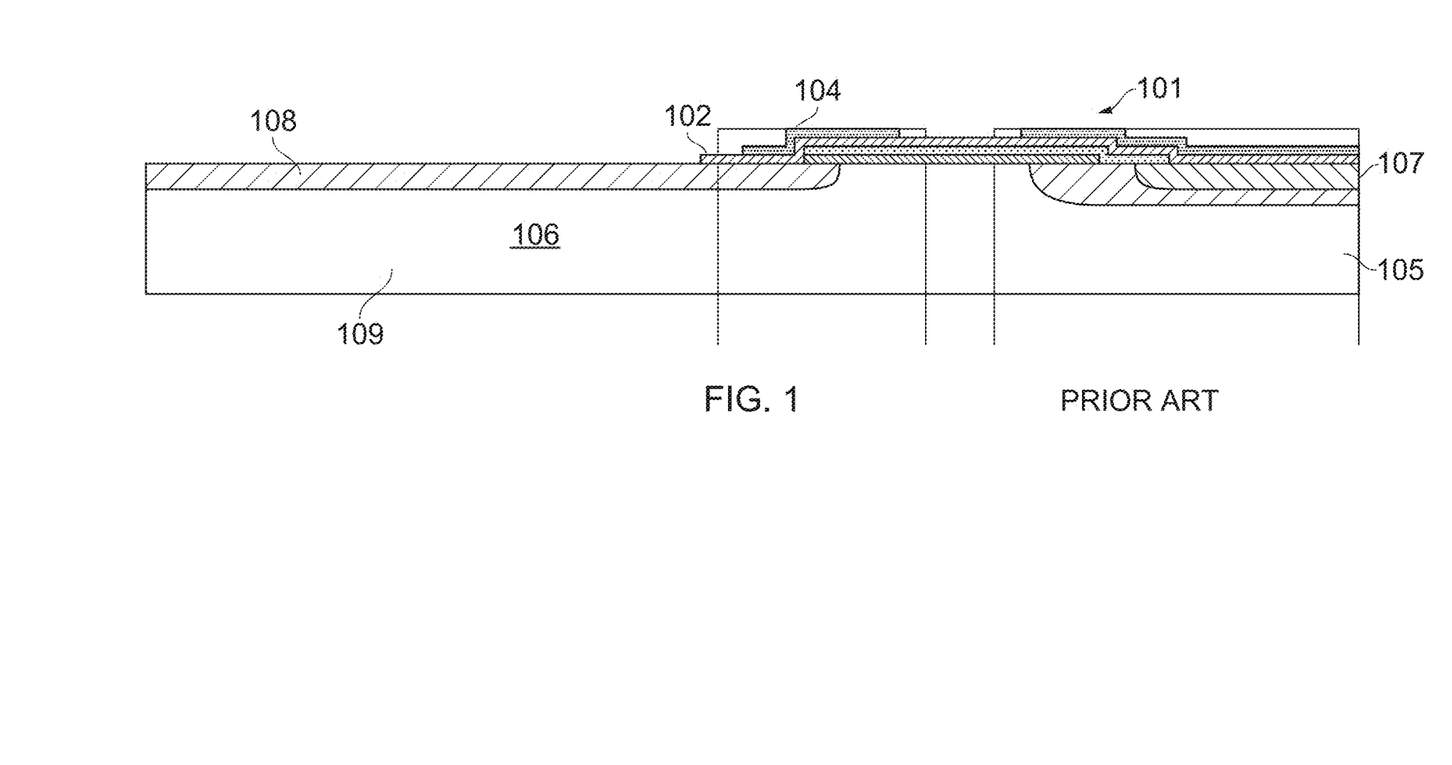
FIG. 1 is a cross-sectional view of a semiconductor device structure including a known edge termination structure.

However, the arrangement isolation layer 102 extending across the channel 108 as illustrated in of FIG. 1 consumes device area on the surface of the substrate 106 and thus limits any reduction in the device footprint.

The isolating layer 102 extends from the edge termination structure on to the guard ring 108 and through holes or vias are formed in the isolating layer 102 over the guard ring 108 to connect the field relief electrode to the guard ring 108. This arrangement consumes space on the semiconductor device and results in a larger than necessary device.

Known edge termination structures, such as the type shown in FIG. 1 are thus a limiting factor on a reduction in the size of semiconductor devices.

SUMMARY

According to an embodiment there is provided a semiconductor device structure comprising: a semiconductor substrate having an edge region laterally separated from a device region; an edge termination structure arranged on the semiconductor substrate; wherein the edge termination structure comprises: a first oxide layer arranged on the substrate to extend from the active region to the edge region; an isolation layer arranged on top of the first oxide layer; and a metal layer arranged to at least partially cover the isolation layer and wherein the metal layer is further arranged to extend from the isolation layer to contact the edge region.

The first oxide layer and the isolation layer may be arranged as vertically stacked layers terminating at the edge region.

The isolation layer may be arranged to be coterminous with the first oxide layer at the edge region. The isolation layer may be arranged to terminate prior to the first oxide layer at the edge region. The isolation layer may arranged to cover the first oxide layer. The edge region of the semiconductor substrate is free from the isolation layer material.

According to embodiments, the semiconductor device structure further comprises a metal layer arranged to at least partially cover the isolation layer and further arranged to extend from the isolation layer to the edge region.

The active region comprises a base region and an emitter region. The first oxide layer contacts a base region of the device region to define the lateral extent of the base region; and a second oxide layer is arranged to contact the emitter region to define the lateral extent of the emitter region.

The second oxide layer is formed between the first oxide layer and the isolation layer and the second oxide layer is arranged to be coterminous with the first oxide layer. The metal layer is a field relief electrode.

According to an embodiment there is also provided a method of manufacturing a semiconductor device, comprising: providing a semiconductor substrate having an edge region laterally separated from an active region; forming an edge termination structure on the semiconductor substrate, wherein forming the edge termination structure comprises: forming a first oxide layer to extend from the active region to the edge region; forming an isolation layer arranged on top of the first oxide; and forming a metal layer to at least partially cover the isolation layer and to extend from the isolation region to contact the edge region.

The isolation layer may formed on the first oxide layer as vertically stacked layer terminating at the edge region. The isolation layer may be formed to be coterminous with the first oxide layer at the edge region.

The isolation layer may be arranged to cover the first oxide layer and the edge region of the semiconductor substrate may be formed to be free from the isolation layer material.

Forming the active region may comprise forming a transistor base and emitter region. The first oxide layer may be formed to contact the base of the device region to define the lateral extent of the base region; and a second oxide is formed to contact the emitter region to define the lateral extent of the emitter region.

The method according to embodiments further comprises forming a metal layer to at least partially cover the isolation layer and to extend from the isolation region to the is edge region.

According to embodiments therefore, the edge termination structure of the present disclosure can provide for reduced device footprint without negatively impacting the electrical performance of the semiconductor device. In addition the method according embodiments can be integrated into standard edge termination formation process flows.

DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 2:
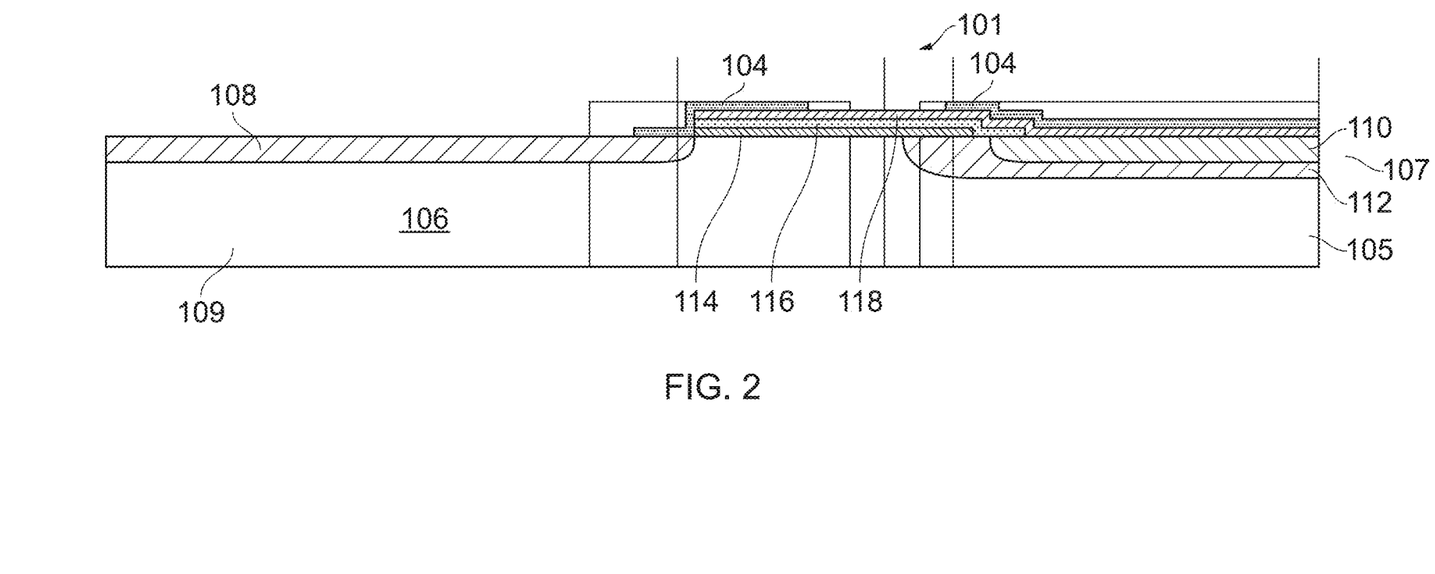
FIG. 2 illustrates a schematic cross-section of a semiconductor device structure including an edge termination structure according to an embodiment.

FIG. 2 illustrates schematic cross-section of a semiconductor device structure including an edge termination structure according to an embodiment. The semiconductor device structure 105 may be formed in a semiconductor substrate 106 and includes an active region 107 and an edge region. The active region may comprise one or more active layers, and the example illustrated in FIG. 2 show a bipolar junction transistor (BJT) which may include base region 112 and an emitter region 110 formed therein. The collector region (not illustrated) may be formed by substrate 106.

Whilst the arrangement of FIG. 2 shows a BJT arrangement, the skilled person will understand that active region may be arranged in any appropriate manner and may be formed as a field effect transistor, a diode or any appropriate active semiconductor device structure. The active region 107 may be formed by any appropriate process such as a diffusion process using any appropriate material such as boron or phosphorous.

A guard ring 108 may also be formed in the semiconductor substrate 106. The active region 107 and the guard ring 108 may be separated by a portion of the substrate 106. The guard ring 108 may be formed by any appropriate process such as a diffusion process using any appropriate material such as boron or phosphorous.

A first oxide layer 114 is arranged on the substrate 106 to extend from the active region 107 on one side of the semiconductor device structure 105 to the guard ring 108 on the opposite side of the semiconductor device structure 105. The first oxide layer 114 may partially cover the active region 107. In addition first oxide layer 114 may extend up to but not over the guard ring 108. Alternatively, and as discussed below with reference to FIG. 4, the first oxide may partially extend over a region of the guard ring 108. The function of the first oxide layer 114 is to define the extent of the active region 107 as discussed below with respect to FIG. 5. The first oxide 114 may be formed of any appropriate oxide material such as $SiO_2$. The first oxide may be a thermal oxide and may be doped or undoped.

In the example illustrated in FIG. 2, the active region 107 comprises a bipolar transistor formed of a base region 112 and an emitter region 110. As shown in FIG. 2, and as discussed above, the active layer 107 is arranged as a base region 112 and an emitter region 110, the first oxide layer may partially extend over and cover a portion of the base region 112.

A second oxide layer 116 may be arranged on the first oxide layer 114. In the location where the first oxide layer 114 extends up to but not over the guard ring 108, the second oxide layer 116 terminates in line with the first oxide layer 114, such that the termination of the second oxide layer 116 is co-vertical with the first oxide layer 114. In the location where the first oxide layer 114 partially extends over and covers a portion of the base region 112, the second oxide layer is arranged in a stepwise manner from the first oxide layer 114 to the substrate 106. In this way the second oxide layer 116 partially covers the active region 107. Where the active region is formed as a base region 112 and an emitter region 110, the second oxide layer 116 partially covers the base region 112 and an emitter region 110.

Whilst the above discussion relates to the formation of a base and emitter in the active region, the skilled person will understand that any number of regions which make up the active region may be included. For example, where the semiconductor device is a diode, and where the substrate is doped, only one region is required in the active region. As such only one oxide layer is required to define the active region 107.

A further oxide layer may be required to form the guard ring 108. Alternatively however, the guard ring 108 may be formed in the substrate prior to formation of the active region and as such only one oxide layer is required The function of the second oxide layer 116 is to define the extent of any further regions, in this example the emitter region 110, in the active region 107 and formation of the guard ring 108 in the same process step. The number of oxide layers required may therefore be dependent on the number of regions making up the active region and the process flow detail where for example it may be possible to define two or more regions with one process step such that only one oxide layer may be required two form two regions. The second oxide 114 may be formed of any appropriate oxide material such as SiO$_2$. The second oxide may be a thermal oxide and may be doped or undoped.

An isolation layer 118 is arranged on the second oxide layer 116. In the location where the first oxide layer 114 and the second oxide layer 116 extends up to but not over the guard ring 108, the isolation layer 118 terminates in line with the first oxide layer 114 and the second oxide layer 116 such that the isolation layer 118 is co-vertical and co-terminus with the first oxide layer 114 and the second oxide layer 116. The isolation layer 118 may be formed of any appropriate oxide material such as SiO$_2$. The isolation layer 118 may be a thermal oxide and may be doped or undoped.

In the location where the second oxide layer 116 is arranged in a stepwise manner from the first oxide layer 114 to the substrate 106, the isolation layer 118 is likewise arranged in a stepwise manner from the second oxide layer 116 to the substrate 106. The isolation layer 118 extends over the active region 107.

In the situation where there is only one oxide layer as discussed above, the isolation layer 118 is arranged on the first oxide layer 114. In the location where the first oxide layer 114 extends up to but not over the guard ring 108, the isolation layer 118 terminates in line with the first oxide layer 114 such that the isolation layer 118 is co-vertical and co-terminus with the first oxide layer 114.

A metal layer 104 is arranged on the isolation layer 118 and the channel region 108. In the location where the first oxide layer 114, the second oxide layer 116 and isolation layer 118 are co-vertical and coterminous, the metal layer 104 is arranged in a step wise manner from the isolation layer 118 to the guard ring 108 of the substrate 108. As a result of this arrangement the metal layer follows the profile of the oxide layer or layers such that it is stepped down onto the guard ring 108 from the oxide layer or layers.

The isolation layer may be arranged to at least partially cover the first oxide layer and the edge region of the semiconductor substrate is formed to be free from the isolation layer material.

The arrangement of the metal layer in this way may provide a number of advantages over known arrangements. By terminating the isolation as co-terminus with the oxide the footprint of the device is reduced, without any effect on device electrical performance when compared to the known devices, because the metal layer contacting the guard ring extends from the first oxide layer over a portion of the guard ring. Furthermore, as discussed below, formation of the edge termination structure may be integrated into standard known process flows as discussed below.

In the location where the first oxide layer 114, second oxide layer 116 and isolation layer 118 are arranged in a stepwise manner, that is, over the active region 107, the metal layer 104 is formed on the isolation layer to follow this stepwise arrangement.

Figure 3:
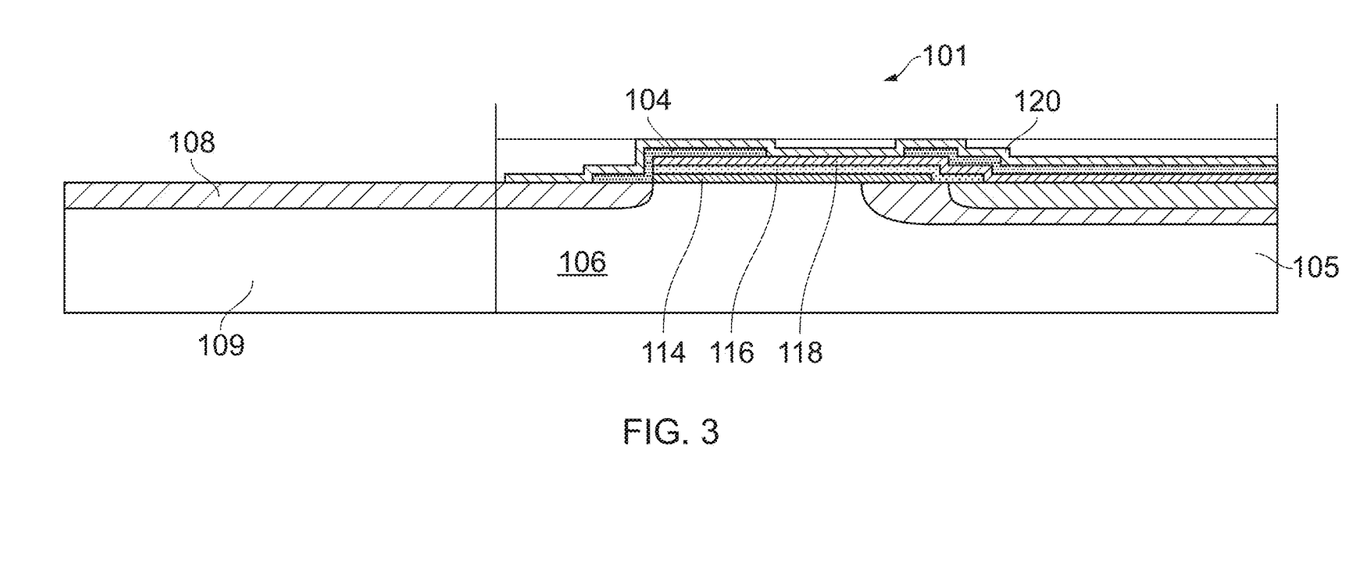
FIG. 3 illustrates a schematic cross-section of a semiconductor device structure including an edge termination structure comprising a passivation layer according to an embodiment.

Optionally, and as illustrated in the embodiment of FIG. 3, the upper surface of the edge termination structure 101 may be covered with a protective layer 120 such as a passivation layer formed of for example SiN.

Figure 4:
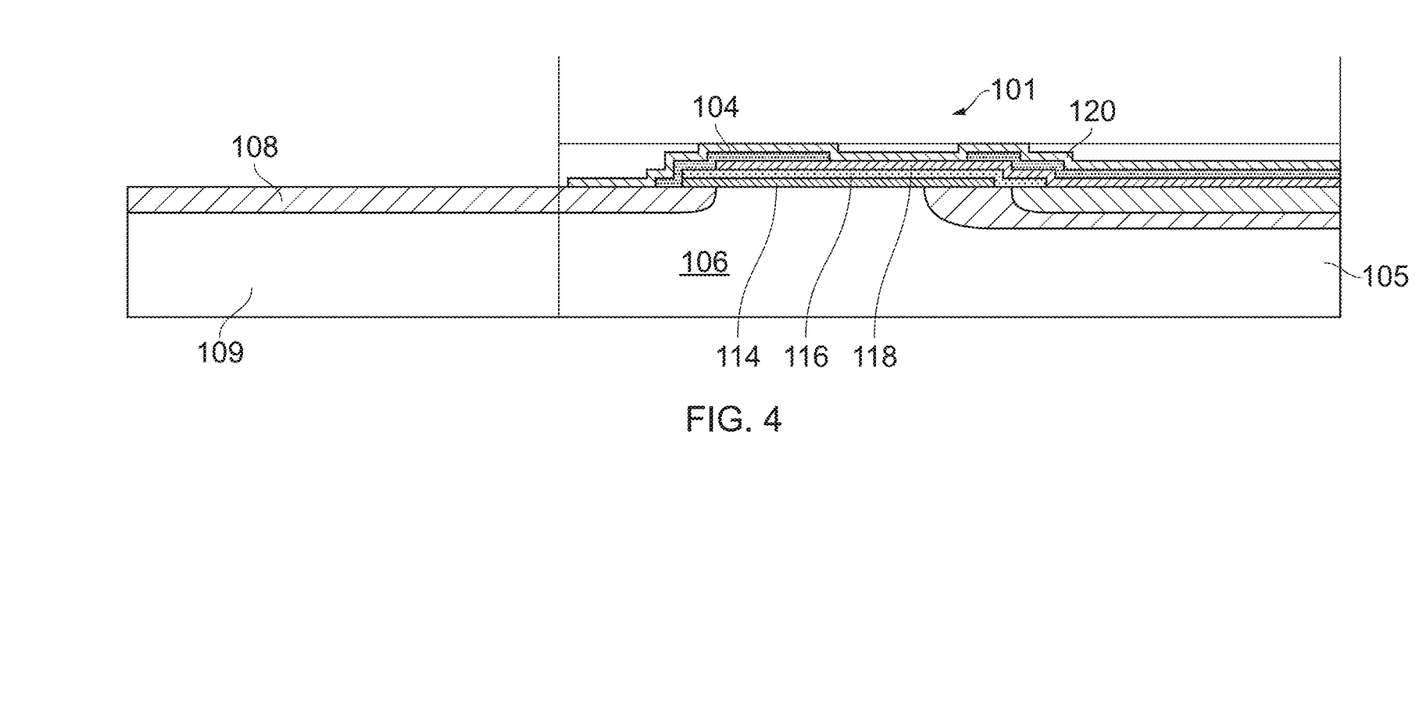
FIG. 4 illustrates a schematic cross-section of a semiconductor device structure including an edge termination structure according to an embodiment.

An alternative arrangement of edge termination structure 101 is illustrated in FIG. 4. Following the arrangement of FIG. 2, at the active region 107 the first oxide layer 114, second oxide layer 116 and isolation layer 118 are arranged in a stepwise manner, and the metal layer 104 is formed on the isolation layer to follow this stepwise arrangement.

The arrangement of FIG. 4 differs from that of FIG. 2, in that the first oxide layer 114 and second oxide layer 116 may partially extend over a region of the channel 108, as mentioned above. As discussed above, the skilled person will see that the number of oxide layers required is dependent on the number of regions making up the active region. As with the arrangement above, the second oxide layer 116 terminates in line with the first oxide layer 114, such that the termination of the second oxide layer 116 is co-vertical with the first oxide layer 114. The isolation layer 118 is arranged on the second oxide layer 116, or in the case of only one oxide layer, on the first oxide layer 114. However, in a variation of the embodiment of FIG. 2, the termination of the isolation layer 118 is not co-vertical or co-terminus with the first oxide layer 114 or the second oxide layer 116. Instead the isolation layer 118 terminates before the termination of the oxide layer or layers.

The metal layer 104 is arranged on the isolation layer 118 and the channel region 108. The metal layer 104 is arranged in a step wise manner from the isolation layer 118 to the channel region 108 of the substrate 108. As a result of this arrangement the metal layer is in direct contact with the channel region 108. As a result of this arrangement the metal layer 104 follows the profile of the oxide layer or layers such that it is stepped down onto the guard ring 108 from the oxide layer or layers. Optionally, the upper surface of the edge termination structure 101 may be covered with a protective layer 120 such as a passivation layer formed of for example SiN.

Figure 5:
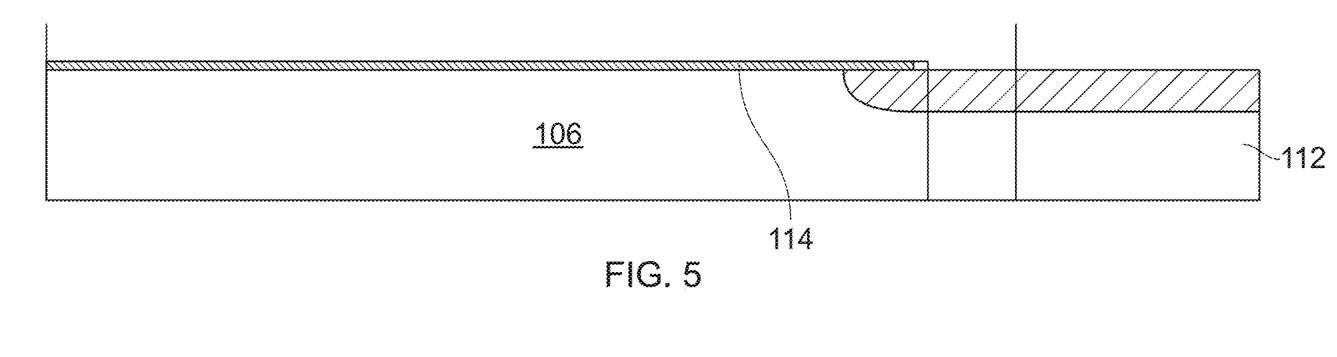
FIG. 5 illustrates a schematic cross-section showing formation of the active region of a semiconductor device structure including an edge termination.
Figure 6:
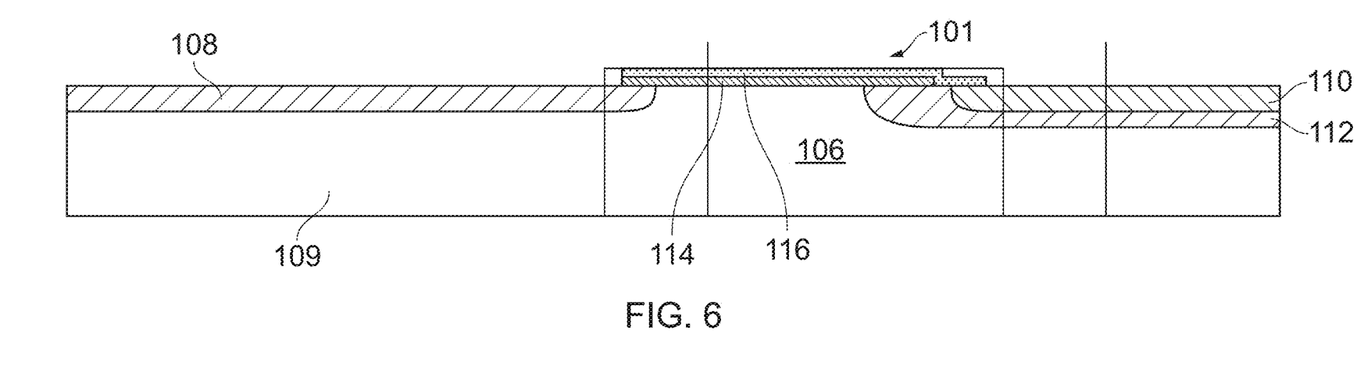
FIG. 6 illustrates a schematic cross-section showing formation of the active region of a semiconductor device structure including an edge termination.
Figure 7:
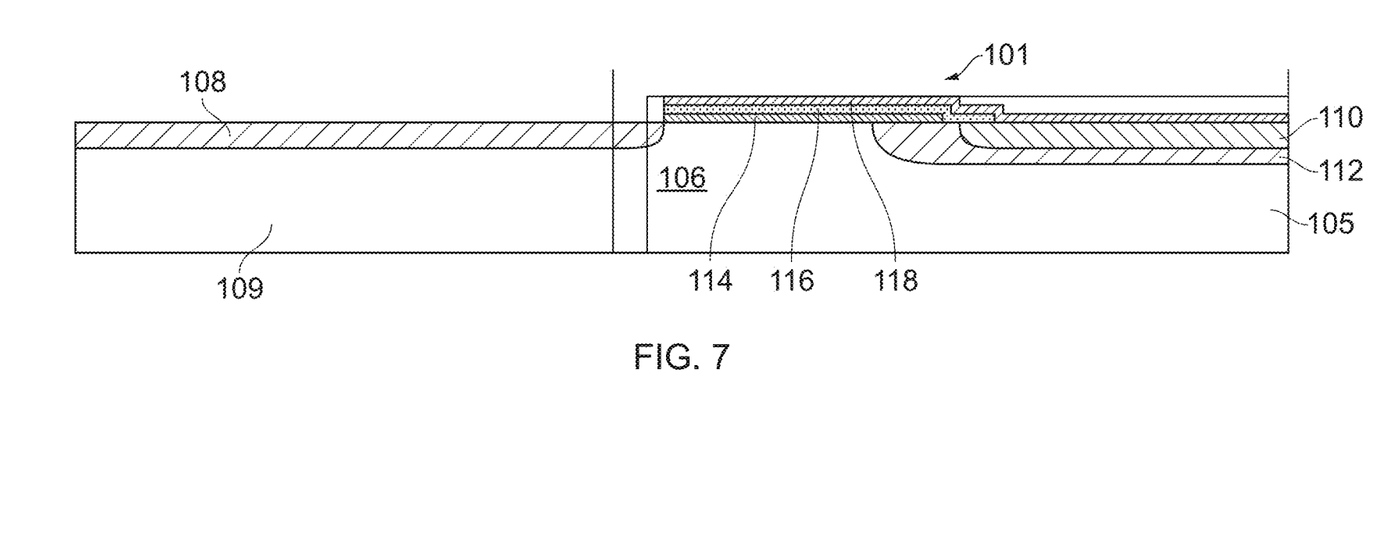
FIG. 7 illustrates a schematic cross-section showing formation of the insulation layer of a semiconductor device structure including an edge termination.

Referring now to FIGS. 5 to 7, an example process flow used in the manufacture of the semiconductor device 105 will be described. The process flow set out below relates to the formation of the first 114 and second 116 oxide layers however, the skilled person will understand that the process is the same for any number of oxide layers.

Starting with FIG. 5, the first oxide layer 114 is arranged on the substrate 106. The substrate 106 may be formed of a semiconductor material such as silicon. The first oxide layer 114 is formed on the substrate 106 by any appropriate process, such as thermal oxidisation and the oxide may be any appropriate material such as a thermal oxide. A portion of the substrate is left uncovered by the first oxide layer 114 and this may be achieved by an appropriate lithographic mask process (not illustrated) formed on the substrate 106 prior to formation of the first oxide layer 114. Following formation of the oxide layer 114, the base region 112 may be formed by any appropriate processing steps such as for example implantation, deposition, diffusion or any combination thereof into the substrate in the portion of the substrate left uncovered by the first oxide layer 114. This is then followed by the formation of the active region to define the base region 112 of the active region 107 of the semiconductor device 105. Likewise, the formation of the guard ring 108 may be carried out simultaneously with the formation of the base region 112.

The as formed second oxide layer 116 is illustrated in FIG. 6. The second oxide layer 116 is formed on the first oxide layer 114 and the base region 112 simultaneously with the base region 112 formation process mentioned above. Through the use of an appropriate method or processes, such as for example lithography, the second oxide 116 is defined over the active region to enable formation of the emitter region.

Following formation of the second oxide layer 116, the emitter region 110 may be formed in the base region 112. The emitter region 110 may be formed by any appropriate processing steps such as for example implantation, deposition, diffusion or any combination thereof, into or on the base region 112 of the substrate left uncovered by the second oxide layer 116. The skilled person will appreciate that the present disclosure is not limited to the formation of an emitter region in a base region, but may be any appropriate active region structure.

At the same time as forming the emitter region, the guard ring 108 is formed in the substrate by implantation of doping ions used in the emitter region 110 formation into the region left uncovered by the second oxide layer 116. Following implantation of the guard ring 108 and the emitter region 110 and the channel region undergo a diffusion process to define the emitter region 110 of the active region 107 and the channel region 108.

Following formation of the insulation layer 118, the metal layer 104 which acts as a field relief electrode may be formed on the insulation layer 118 and directly on the guard ring 108 above the edge region as illustrated in FIG. 2. Likewise, the metal may be formed on the insulation layer 118 above the active region 107 to form appropriate contacts to the active region. The metal used may any appropriate type such as nickel, titanium, tungsten, platinum, aluminium or alloys thereof. The metal layer 104 may be formed by any appropriate process such as sputtering or evaporation and structured, for example, by lithography processes.

The metal layer 104 is arranged such that it conforms to the underlying first and second oxide layers 114, 116, insulation layer 118 and the channel region 108 formed in the substrate 106 and follows the profile thereof. Likewise, in the case where only one oxide is present the metal layer 104 is arranged such that it conforms to the underlying first oxide layer 114.

In the alternative embodiment of FIG. 4, the metal layer 104 may be formed on the insulation layer 118, the second oxide layer 116 and directly on the channel region 108.

Following formation of the metal layer 104 the protective layer 120 is formed to cover the edge termination structure 101 as illustrated in FIGS. 2 and 4. The protective layer 120 may be any appropriate protective layer such as a SiN layer. The protective layer may provide scratch protection and passivation and can result in an improved blocking voltage figure of merit.

According to embodiments therefore, the edge termination structure of the present disclosure can provide for reduced device footprint without negatively impacting the electrical performance of the semiconductor device.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A semiconductor device structure comprising:
   a semiconductor substrate having an edge region laterally separated from an active region;
   an edge termination structure arranged on the semiconductor substrate; wherein the edge termination structure comprises:
   a first oxide layer arranged on the substrate to extend from the active region to an edge region or before the edge region;
   an isolation layer arranged on top of the first oxide layer; and
   a metal layer arranged to at least partially cover the isolation layer, wherein the metal layer is further arranged to extend from the isolation layer to contact the edge region.

2. The semiconductor device of claim 1, wherein the first oxide layer and the isolation layer are arranged as vertically stacked layers terminating at the edge region.

3. The semiconductor device of claim 1, wherein the isolation layer is arranged to be coterminous with the first oxide layer at the edge region.

4. The semiconductor device of claim 1, wherein the isolation layer is arranged to cover the first oxide layer.

5. The semiconductor device of claim 1, wherein the isolation layer is arranged to terminate prior to the first oxide layer at the edge region.

6. The semiconductor device of claim 1, wherein the edge region of the semiconductor substrate is free from the isolation layer material.

7. The semiconductor device of claim 1, wherein the active region comprises a transistor base region and an emitter region.

8. The semiconductor device of claim 7, wherein the first oxide layer contacts the transistor base region of the device region to define a lateral extent of the base region; and a second oxide layer is arranged to contact the emitter region to define a lateral extent of the emitter region.

9. The semiconductor device of claim 8 wherein the second oxide layer is formed between the first oxide layer and the isolation layer and the second oxide layer is arranged to be coterminous with the first oxide layer.

10. The semiconductor device of claim 1, wherein the metal layer is a field relief electrode.

11. A method of manufacturing a semiconductor device, comprising:
   providing a semiconductor substrate having an edge region laterally separated from an active region;
   forming an edge termination structure on the semiconductor substrate, wherein forming the edge termination structure comprises:
   forming a first oxide layer to extend from the active region to the edge region;
   forming an isolation layer arranged on top of the first oxide layer; and
   forming a metal layer to at least partially cover the isolation layer and to extend from an isolation region to contact the edge region.

12. The method of claim 11, wherein the isolation layer is formed to be coterminous with the first oxide layer at the edge region.

13. The method of claim 11, wherein the isolation layer is arranged to cover the first oxide layer and the edge region of the semiconductor substrate is formed to be free from the isolation layer material.

14. The method of claim 11, wherein forming the active region comprises forming a transistor base and emitter region.

15. The method of claim 14, wherein the first oxide layer is formed to contact the transmitter base of the active region to define a lateral extent of the transmitter region base region; and a second oxide is formed to contact the emitter region to define a lateral extent of the emitter region.

* * * * *